US011463056B2

(12) United States Patent
Morello et al.

(10) Patent No.: US 11,463,056 B2
(45) Date of Patent: Oct. 4, 2022

(54) INTEGRATED CIRCUIT WITH AN INPUT MULTIPLEXER SYSTEM

(71) Applicant: NXP USA, Inc., Austin, TX (US)

(72) Inventors: Carmelo Morello, San Jose, CA (US); Hanqing Xing, Sunnyvale, CA (US); Ranga Seshu Paladugu, Milpitas, CA (US); Soon G. Lim, San Jose, CA (US)

(73) Assignee: NXP USA, Inc., Austin, TX (US)

( * ) Notice: Subject to any disclaimer, the term of this patent is extended or adjusted under 35 U.S.C. 154(b) by 13 days.

(21) Appl. No.: 16/953,583

(22) Filed: Nov. 20, 2020

(65) Prior Publication Data

US 2022/0166395 A1 May 26, 2022

(51) Int. Cl.
*H03F 3/68* (2006.01)
*H03F 1/52* (2006.01)

(52) U.S. Cl.
CPC ............. *H03F 3/68* (2013.01); *H03F 1/523* (2013.01); *H03F 2200/165* (2013.01); *H03F 2200/441* (2013.01); *H03F 2200/504* (2013.01); *H03F 2200/78* (2013.01)

(58) Field of Classification Search
CPC ...... H03F 3/68; H03F 1/523; H03F 2200/165; H03F 2200/441; H03F 2200/504; H03F 2200/78
USPC ......................................... 330/278, 51, 10, 9
See application file for complete search history.

(56) References Cited

U.S. PATENT DOCUMENTS

| 4,739,189 A | 4/1988 | Kellogg |
| 6,157,529 A | 12/2000 | Ahuja |
| 8,396,089 B2 | 3/2013 | Schaffer et al. |
| 8,411,403 B2 | 4/2013 | Divan |
| 8,587,461 B1 | 11/2013 | Mitchell |
| 2011/0031812 A1* | 2/2011 | Morimoto ............... B60L 3/12 307/77 |

OTHER PUBLICATIONS

ADI, "Choosing the Correct Switch, Multiplexer, or Protection Product for Your Application", Analog Devices, Inc., Choosing the Correct Switch, Multiplexer, or Protection Product for Your Application, http://www.analog.com/switch-mux, USA, 2011, pp. 1-8.
Alani, et al.: "MUX-Friendly Precision Operational Amplifiers", SBOT040A, Texas Instruments Incorporated, TechNotes, Sep. 2017, pp. 1-3.

* cited by examiner

*Primary Examiner* — Khanh V Nguyen
*Assistant Examiner* — Khiem D Nguyen

(57) ABSTRACT

An integrated circuit includes a multiplexer circuit configured to provide an output signal on a conductive line, a programmable gain amplifier having a non-inverting input connected to the conductive line to receive the output signal from the multiplexer, a slew rate adjust circuit connected at a first node on the conductive line between the multiplexer circuit and the programmable gain amplifier, a first switch including a first terminal connected to the first node and a second terminal connected to the input of the programmable gain amplifier, and a low pass filter connected between the first and second terminals of the first switch.

19 Claims, 8 Drawing Sheets

US 11,463,056 B2

INTEGRATED CIRCUIT WITH AN INPUT MULTIPLEXER SYSTEM

BACKGROUND

Field

This disclosure relates generally to integrated circuits, and more specifically, to an integrated circuit with an input multiplexer system.

Related Art

In a typical data acquisition system, an input multiplexer (MUX) is followed by a programmable gain amplifier (PGA) for buffering and gain scaling before signal digitization with an analog-to-digital converter (ADC). However, the amplifier typically has limited slew rate capability. Although the switching speed of the input MUX can be fast, the switching speed of the data acquisition system is often limited by the slew rate of the input amplifier. That is, the input signal is typically slowed down significantly based on the worst case scenario so as to allow the slewing amplifier to operate within its safe-operating region and settle at the targeted accuracy for the ADC digitization. This results in limiting the switching speed of the input MUX system. Therefore, a need exists for an input MUX system which can provide improved switching speed with any given slew rate limited amplifier, while maintaining accuracy.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, in order to provide an improved input MUX system which is capable of providing high speed switching, the output of the MUX is either pulled up to a positive supply voltage or pulled down to ground or a negative supply voltage during a break-before-make time occurring when the input MUX switches from one input channel to another. In another aspect, an additional switch in parallel with a resistor is inserted between the MUX output and an input to the PGA such that, with the switch open, the resistor, in combination with a capacitor coupled to the PGA input, forms a resistor-capacitor (RC) filter between the MUX output and the PGA input, but once the switch is closed, the resistor is shorted so as to more quickly charge the capacitor. Therefore, in one embodiment, upon the input MUX switching to a next input channel, the switch is initially open, and then, a predetermined amount of time later and while the next input is still selected, the switch is closed. These aspects can be used independently or may be used in combination with each other to provide an input MUX system with high speed switching.

Figure 1:
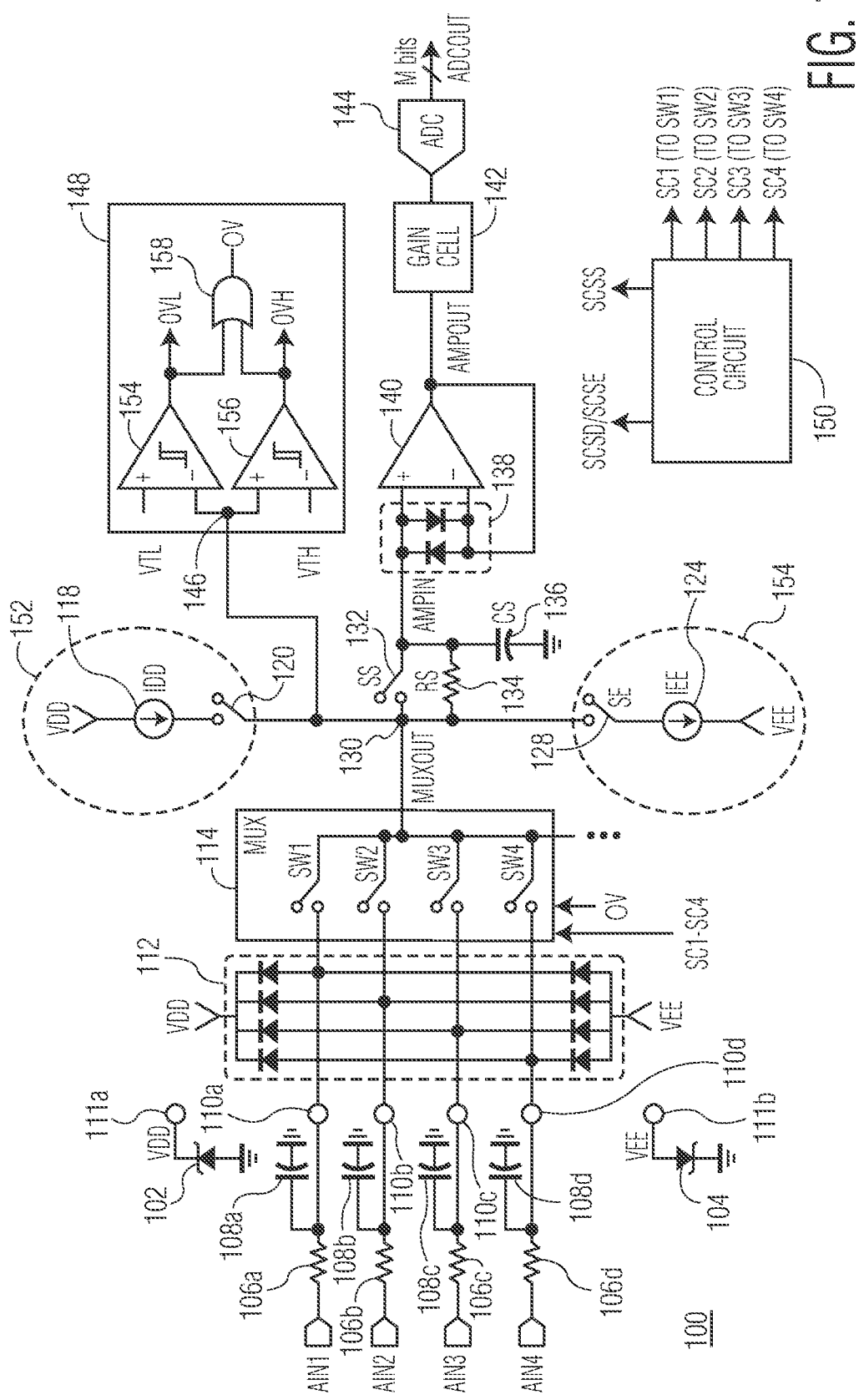
FIG. 1 illustrates, in block diagram form, an input MUX system having an input MUX in accordance with one embodiment of the present invention.

FIG. 1 illustrates an input MUX system 100, in accordance with one embodiment of the present invention. System 100 is coupled to a first power supply terminal, configured to provide a first supply voltage (VDD), and a second power supply terminal, configured to provide a second supply voltage (VEE). VDD is greater than VEE, in which VEE may be a negative supply voltage or ground. VEE may also be referred to as VSS. Note that the first power supply terminal may simply be referred to as VDD and the second power supply terminal as VEE. System 100 includes external pins 110a-d and 111a-b (also referred to as external terminals). Pin 111a corresponds to the first power supply terminal which supplies VDD, and pin 111b corresponds to the second power supply terminal which supplies VEE. System 100 includes protection diodes 112, an input MUX 114, a unity gain amplifier 140, a gain cell 142, an analog-to-digital converter (ADC) 144, and control circuit 130. Unity gain amplifier 140 together with gain cell 142 form a programmable gain amplifier (PGA), in which an input of amplifier 140 corresponds to an input of the PGA, and an output of the gain cell corresponds to an output of the PGA. In one embodiment, everything from external pins 110 and 111 and to the right of system 100 may be implemented on a single integrated circuit (IC).

System 100 includes four input channels, each input channel receiving a corresponding analog input signal, AIN1-AIN4, via a corresponding pin 110. System 100 receives each of signals AIN1-AIN4 through a corresponding input RC filter, including a corresponding resistor 106a-106d and corresponding capacitor 108a-108d. These input RC filters are typically located off chip and may therefore not be included as part of system 100. Input MUX 114 has four inputs, each input coupled to a corresponding input channel to receive one of AIN1-AIN4, and an output which provides a selected one of AIN1-AIN4 as MUXOUT onto a conductive line at a circuit node 130. MUX 114 includes four switches in which each switch is coupled between an input channel and the output. For example, switch 1 (SW1), when closed, provides AIN1 as MUXOUT, switch 2 (SW2), when closed, provides AIN2 as MUXOUT, switch 3 (SW3), when closed, provides AIN3 as MUXOUT, and switch 4 (SW), when closed, provides AIN4 as MUXOUT. In operation, one of SW1-SW4 can be closed to provide a selected one of AIN1-4 as MUXOUT, in which switch control signals SC1-SC4 can be provided to each of SW1-SW4, respectively, by control circuit 150.

Although system 100 and MUX 114 are illustrated in FIG. 1 as having four input channels and four MUX inputs, respectively, system 100 may include any number, N, of input channels (and thus N pins 110), in which MUX 114 would have N MUX inputs coupled via N corresponding switches to the output of MUX 114. The value N can be any integer number greater than or equal to two. Note that, during operation, only one switch of MUX 114 can be closed (i.e. on) at a given time so that input signals do not collide on MUXOUT.

For any of the switches in FIG. 1 (e.g. switches SW1-SW4, SS, SD, and SE), when a corresponding switch control signal is asserted, the corresponding switch is closed or on, such that the switch is in its conductive state, and when the switch control signal is negated (or deasserted), the corresponding switch is open or off, such that it is non-conductive state. Therefore, the use of on or closed for a switch may be used interchangeably, and the use of off or open for a switch may be used interchangeably.

Still referring to system 100 of FIG. 1, protection diodes 112 (also referred to as ESD clamping diodes) include a diode coupled between each input channel and VDD (in which the diode cathodes are coupled to VDD) and a diode coupled between each input channel and VEE (in which the diode anodes are coupled to VEE). In one embodiment, a Zener diode 102 is coupled between pin 111a and ground, and a Zener diode is coupled between pin 111b and ground. The cathode of diode 102 is coupled to pin 111a and the anode to ground, and the anode of diode 104 is coupled to pin 111b and the cathode to ground. Diodes 102 and 104 may be located off-chip and therefore may be located outside of system 100. Protection diodes 112 are on-chip clamping diodes which shunt currents to VDD and VEE during surge events (or during electrostatic discharge (ESD) events), and diodes 102 and 104 offer further protection off-chip by shunting the currents to ground.

In the illustrated embodiment, system 100 includes a pull-up circuit 152 and a pull-down circuit 154. However, an integrated circuit designed with system 100 would include only one of pull-up circuit 152 or pull-down circuit 154. Alternatively, the integrated circuit could have both, but with one of the pull-up or pull-down circuit disabled such that only one of the pull-up or pull-down circuit is operative within system 100.

Pull-up circuit 152 includes a current source IDD 118 and a switch SD 126. A first terminal of IDD 118 is coupled to VDD, and a second terminal of IDD 118 is coupled to a first terminal of SD 126. A second terminal of SD 126 is coupled to circuit node 130. A control signal, SCSD, provided by control circuit 150 controls SD 126. Pull-down circuit 154 includes a current source IEE 124 and a switch SE 128. A first terminal of SE 128 is coupled to circuit node 130, and a second terminal of SE 128 is coupled to a first terminal of IEE 124. A second terminal of IEE 124 is coupled to VEE. A control signal, SCSE, provided by control circuit 150 controls SE 128. Note that control circuit 150 provides only one of SCSD or SCSE based on whether pull-up circuit 152 or pull-down circuit 154 is present in system 100, therefore, the control signal provided by control circuit 150 is labeled as "SCSD/SCSE" to indicate that one or the other control signal is provided.

System 100 includes an amplifier 140 which receives an analog amplifier input signal, AMPIN, at a non-inverting input, and provides an output signal, AMPOUT, at an output. The output of amplifier 140 is coupled to an inverting input of amplifier 140. A pair of anti-parallel diodes 138 is coupled between the non-inverting and inverting inputs of amplifier 140. The analog amplifier output signal, AMPOUT, is provided to gain cell 142. Gain cell 142 has a programmable gain, and the amplified analog output of gain cell 142 is provided to ADC 144. Therefore, amplifier 140 together with gain cell 142 form a PGA, in which AMPIN is provided to the input of the PGA, and the output of the PGA is provided to ADC 144. ADC 144 converts the analog signal from gain cell 142 to an M-bit digital output, ADCOUNT, in which M corresponds to the accuracy of the conversion. That is, the greater the value of M, the greater the accuracy of conversion.

System 100 includes a switch SS 132, a resistor RS 134, and a capacitor CS 136. SS 132 has a first terminal coupled to circuit node 130 and a second terminal coupled to the non-inverting input of amplifier 140. SS 132 is controlled by switch control signal SCSS provided by control circuit 150. RS 134 is coupled in parallel with SS 132, in which a first terminal of RS 134 is coupled to circuit node 130 and a second terminal is coupled to the non-inverting input of amplifier 140. CS 136 has a first terminal coupled to the non-inverting input of amplifier 140, and a second terminal coupled to ground.

System 100 also includes an over-voltage detection circuit 148 which includes comparators 154 and 156, and an OR gate 158. Comparator 154 receives a low voltage threshold voltage, VTL, at a first input (e.g. non-inverting input) and a second input (e.g. inverting input) is coupled to circuit node 130. Comparator 156 receives a high voltage threshold voltage, VTH, at a first input (e.g. inverting input) and a second input (e.g. non-inverting input) is coupled to circuit node 130. And output of comparator 154 provides an over-voltage indicator, OVL, based on VTL, and an output of comparator 156 provides an over-voltage indicator, OVH, based on VHL. In the illustrated embodiment, comparators 154 and 156 are implemented with hysteresis. A first input of OR gate 158 is coupled to the output of comparator 154, and a second input of OR gate 158 is coupled to the output of comparator 156. An output of OR gate 158 provides an over-voltage indicator, OV. OV is provided to MUX 114.

In operation, system 100 receives an analog input signal from an input source on one of its channels, and control circuit 150 asserts the corresponding switch control signal to close the corresponding switch. In this manner, the received analog signal is provided as MUXOUT to circuit node 130. For example, if analog input signal AIN1 is received, SC1 is asserted to close SW1 such that AIN1 is provided as MUXOUT. When a next analog input signal is received (e.g. AIN2), SC1 is negated to open SW1, and the switch corresponding to the next analog input signal (e.g. SW2) is closed such that the next analog input signal (e.g. AIN2) is provided as MUXOUT. MUXOUT is either provided as AMPIN to amplifier 140 (if SS 132 is closed) or provided via an RC filter formed by RS 134 and CS 136 as AMPIN to amplifier 140 (if SS 132 is open). The PGA formed by amplifier 140 and gain cell 142 buffers and amplifies the received input analog signal and provides the amplified signal to ADC 144, which converts the amplified signal to digital signal ADCOUT.

Without the presence of pull-up circuit 152 and pull-down circuit 154 and without the presence of SS 132 and RS 134 (in which node 130 is connected to the non-inverting input of amplifier 140 such that MUXOUT is directly provided as AMPIN), when MUX 114 switches from one input source to another, a step-function pulse is produced on AMPIN at the non-inverting input of amplifier 140 due to the change in voltage levels in the input analog signals. Amplifier 140 has limited slew-rate capability and is unable to handle the fast switch at its input. Anti-parallel diodes 138 clamp the inputs of amplifier 140 for device protection such that all devices are ensured to operate within safe voltage limits during this slew condition, however, when these anti-parallel diodes are triggered, a large current is drawn from the input source. This disturbs the voltage level of the input voltage which then requires a longer time for the PGA to resettle. Therefore, various elements of system 100 help address the issues caused by MUX 114 switching between input sources (and thus input channels).

Operation of system 100, including operation of pull-up circuit 152 or pull-down circuit 154 as well as SS 132 and RS 134, will be described in more detail below, in combination with the timing diagrams of FIGS. 2-4. To address the slew-rate limitations of amplifier 140, in a first aspect, pull-up circuit 152 or pull-down circuit 154 is used during a break-before-make time of MUX 114. For an unsymmetrical slew rate for amplifier 140, MUXOUT is either pulled up or pulled down during the make-before-break time. In the case of a faster positive slew rate as compared to the negative slew rate, pull-down circuit 154 is used in system 100. In this case, pull-up circuit 152 need not be present in system 100. In the case of a faster negative slew rate as compared to the positive slew rate, pull-up circuit 152 is used in system 100 (and pull-down circuit 154 need not be present in system 100). The positive slew rate corresponds to the slew rate of the ramp up from a lower voltage level to a higher voltage level and the negative slew rate corresponds to the slew rate of the ramp down from a higher voltage level to a lower voltage level. Therefore, pull-up circuit 152 and pull-down circuit 154 may also be referred to as slew rate adjust circuits.

Figure 2:
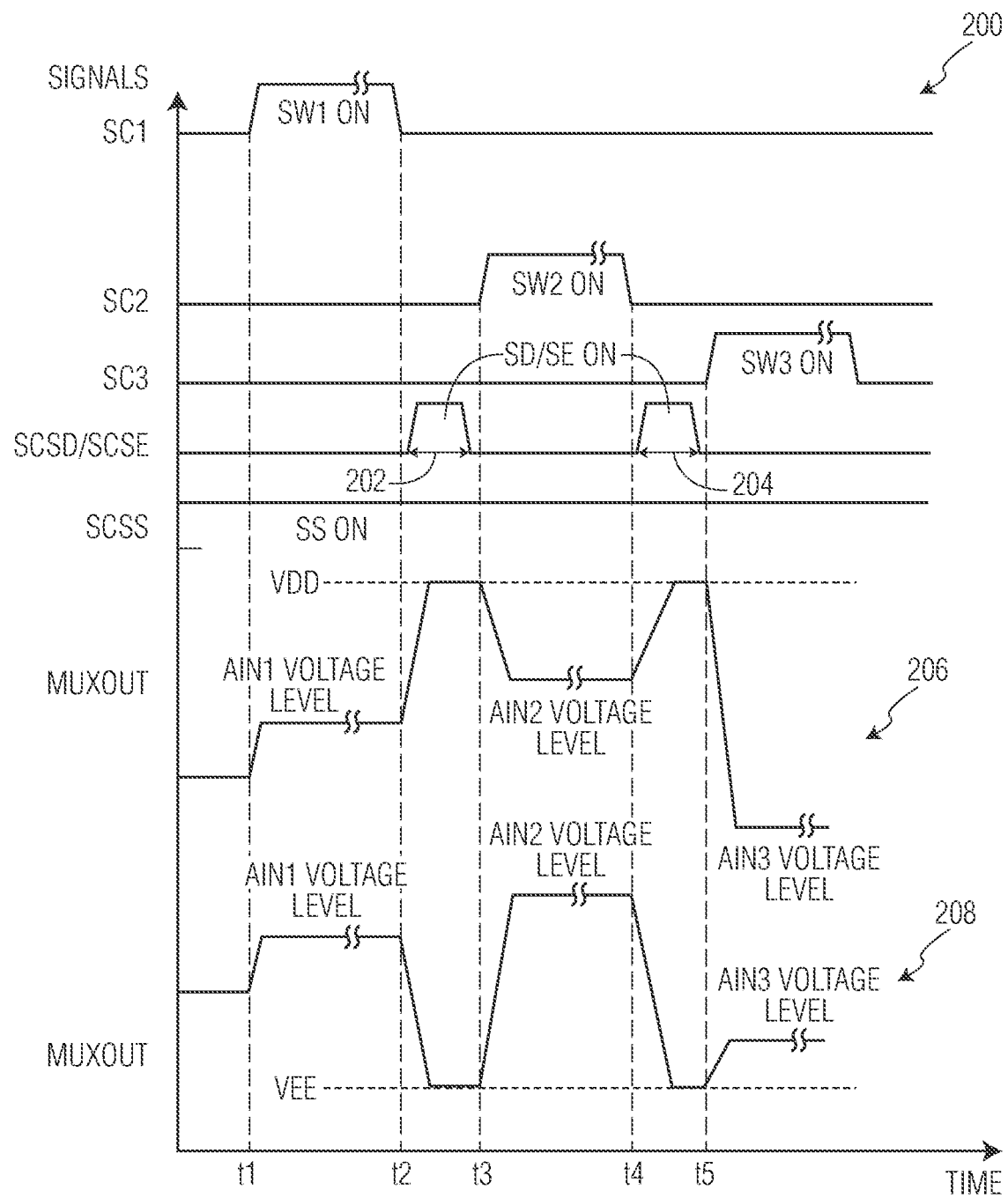
FIGS. 2-4 are timing diagrams illustrated various signals within the input MUX system of FIG. 1, in accordance with embodiments of the present invention.

FIG. 2 illustrates signals in system 100 in accordance with the first aspect, with a pull-up or pull-down occurring during the make-before-break time, in which waveform 206 corresponds to MUXOUT when pull-up circuit 152 is present in system 100, and waveform 208 corresponds to MUXOUT when pull-down circuit 154 is present in system 100. As mentioned above, one of pull-up circuit 152 or pull-down circuit 154 can be selected for inclusion into system 100 at design time, and this decision can be made based on the positive and negative slew rates of the worst case scenario of amplifier 140 within a particular group of die (e.g. a wafer or a lot). Note that, in this embodiment, SCSS is asserted such that SS 132 is always on (e.g. closed).

Referring to FIG. 2, at time t1, SC1 is asserted to turn on (e.g. close) SW1 of MUX 114 so as to provide AIN1 as MUXOUT. Therefore, as seen in both waveforms 206 and 208, MUXOUT increases to the voltage level of AIN1 upon closing SW1. With SS 132 on and thus in its conductive state, MUXOUT is provided directly as AMPIN to the PGA. ADCOUT is generated based on AIN1. Upon a switch in MUX 114 from the input source for AIN1 to the input source for AIN2, SC1 is first negated, at time t2, so as to turn off (e.g. open) SW1. Note that the parallel break lines indicate that SW1 can be on for any length of time (and thus MUXOUT remains at the AIN1 level for the same length of time). The turning off SW1 at time t2 begins make-before-break time 202. Make-before-break time 202 can be set to a predetermined duration and controlled by control logic 150. Note that the make-before-break time 202 is typically much shorter than the duration of time that any switch (e.g. SW1) in MUX 114 is on. During make-before-break time 202, MUXOUT is pulled to VDD or VEE. In the case of waveform 206, at time t2, SCSD is asserted so as to turn on (e.g. close) SD 121, thus enabling IDD 118 to pull MUXOUT at node 130 up to VDD. In the case of waveform 208, at time t2, SCSE is asserted so as to turn on (e.g. close) SE 128, thus enabling IEE 124 to pull MUXOUT at node 130 down to VEE.

After the make-before-break time, control logic 150 asserts SC2 at time t3 which turns on SW2 of MUX 114 so as to now provide AIN2 as MUXOUT. Therefore, in waveform 206, MUXOUT drops from VDD to the voltage level of AIN2, and in waveform 208, MAXOUT rises from VEE to the voltage level of AIN2. Due to the pull-up or pull-down of MUXOUT prior to turning on SW2, amplifier 140 is able to operate with its highest slew rate. The external input RC low-pass filter (corresponding to resistor 106 and capacitor 108) may also be sized to loosely match the slower slewing edge of amplifier 140 to low-pass filter the fast step of the signal at the active input channel (e.g. the channel for AIN2).

Upon a subsequent switch in MUX 114 from the input source for AIN2 to the input source for AIN3, a make-before-break time 204 is used, starting at time t4, between turning off SW2 and turning on SW3. Again, the parallel lines indicate that SW2 and SS 132 can remain turned on for any length of time (and thus MUXOUT remains at the AIN2 level for the same length of time). During make-before-break time 204 (which can be the same predetermined duration as make-before-break time 202), MUXOUT is again either pulled up to VDD (as in waveform 206) or pulled down to VEE (as in waveform 208). After make-before-break time 204, at time t5, SW3 is turned on, as is SS 132.

By using a make-before-break time to either pull-up or pull-down MUXOUT between changes in input channel by MUX 114, system 100 can avoid triggering anti-parallel diodes 138. This prevents the large current draw and the resulting increase in settling time for the PGA. The additional make-before-break times occur between each time a switch in MUX 114 is turned off and another switch in MUX 114 is turned on, but are smaller in duration than the increase in settling time required when anti-parallel diodes 138 are triggered. Therefore, the pulling-up or pulling-down of MUXOUT between switches in input channels in MUX 114 can result in faster switching without losing accuracy in ADCOUT. Note that, in one embodiment, in which either pull-up circuit 152 or pull-down circuit 154 is present, SS 132 and RS 134 may not be present, such that node 130 is connected to the non-inverting input of amplifier 140. The duration of the make-before-break time can be determined during design time and programmed into control circuit 150 so that the timing of the switch control signals can be provided accordingly. Alternatively, the make-before-break time duration can be determined and programmed by control circuit 150 during operation of system 100.

Figure 3:
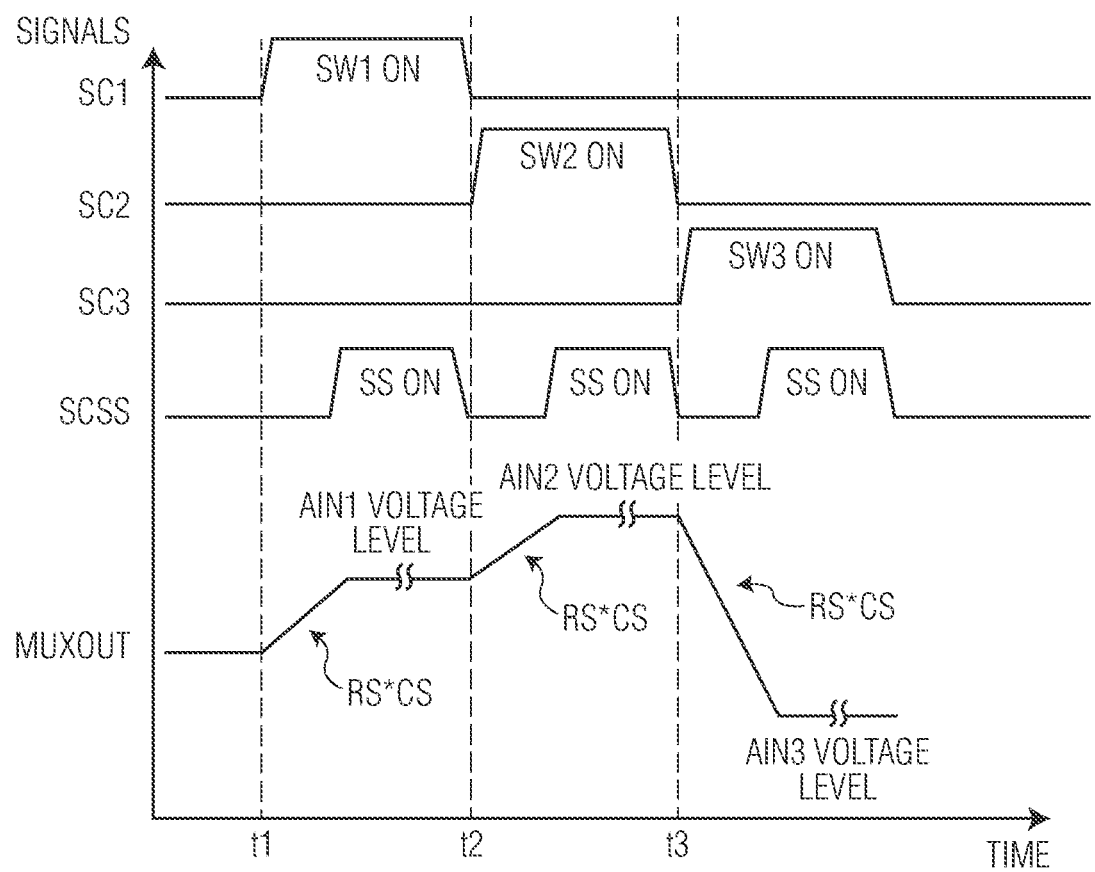

FIG. 3 illustrates signals in system 100 in which neither pull-up circuit 152 nor pull-up circuit 154 is present, but SS 132 and RS 134 are present between node 130 and the non-inverting input of amplifier 140 in accordance with a second aspect. In FIG. 3, there are only minimal make-before-break times between the switching of channels with MUX 144. At time t1, SC1 is asserted so as to turn on SW1 but SS 132 remains off (open). Therefore, starting at time t1, MUXOUT starts rising towards AIN1. With SS 132 off, the RC filter formed by RS and CS forms a low pass filter in which the time constant (corresponding to RS*CS) is matched (or proportional) to the slew rate of amplifier 140. A short duration of time after t1, but while SW1 is still selected (i.e. on), SS 132 is closed so as to speed up the charging of CS by shorting RS. The short time duration after t1 at which to close SS 132 is determined based on the voltage difference between MUXOUT and AMPIN at t1. This may be a predetermined amount of time determined during design time of system 100 and controlled by control logic 150. Therefore, as seen in FIG. 3, at time t1 MUXOUT rises to AIN1 in accordance with the time constant corresponding to RS*CS.

Upon a next switch by MUX 114 at time t2, SW1 is turned off and SW2 is turned on. When SW1 is turned off, so is SS 132. Since there is no pull-up or pull-down of MUXOUT, at time t2, MUXOUT transitions from AIN1 to AIN2 in accordance with the time constant corresponding to RS*CS. After the predetermined short duration of time from time t2 (while SW2 is still selected), SS 132 is closed so as to quickly charge CS. Similarly, at time t3, SW2 and SS 132 are turned off (opened), and SW3 is turned on. MUXOUT transitions from AIN2 to AIN3 in accordance with the time constant corresponding to RS*CS, and after the predetermined short duration of time from time t3 (while SW3 is still selected), SS 132 is again closed. By using SS 132 to short out RS 134 at some point after switching to a next input channel by MUX 114, CS 136 is charged faster thus allowing for faster settling of amplifier 140 as compared to not shorting out RS 134. Note that upon a channel selection by MUX 114, the corresponding switch (as well as SS 132) can remain on for any length of time (and thus MUXOUT remains at the input level for the same length of time).

Figure 4:
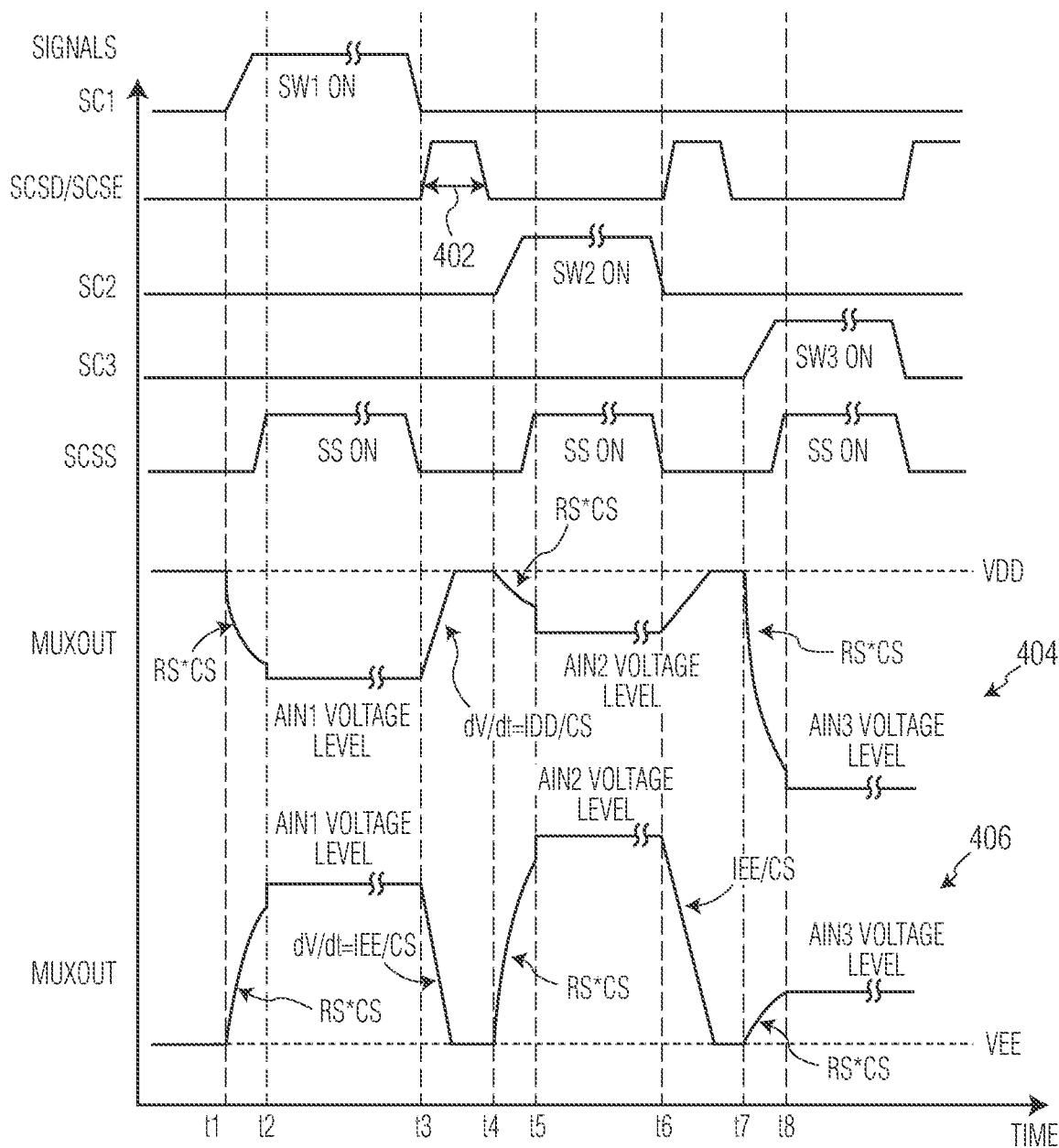

FIG. 4 illustrates signals in system 100 which combines the use of the pull-up or pull-down circuit during a make-or-break time, in accordance with the first aspect, with the use of SS 132 to short RS 134 shortly after turning on a switch within MUX 114, in accordance with the second aspect, to achieve the benefits of both aspects. This may result in yet a greater improvement in switching speed, without sacrificing ADC accuracy. In FIG. 4, waveform 404 corresponds to MUXOUT when pull-up circuit 152 is present in system 100, and waveform 206 corresponds to MUXOUT when pull-down circuit 154 is present in system 100.

Referring to FIG. 4, at time t1, SC1 is asserted to turn on (e.g. close) SW1 of MUX 114 so as to provide AIN1 as MUXOUT. However, at time t1, SS 132 remains off. Therefore, as seen in both waveforms 404 and 406, upon closing SW1 at time t1, MUXOUT begins transitioning to the voltage level of AIN1 in accordance with the time constant corresponding to RS*RC (since RS 134 is not shorted out). At time t2, which occurs a predetermined short amount of time after t1 but while SW1 is still on, SS 132 is turned on (e.g. closed), allowing MUXOUT to quickly finish transitioning to AIN1, no longer in accordance with the time constant (since RS 134 is shorted out). As in FIG. 3, the predetermined short amount of time after t1 at which to close SS 132 can be determined based on the voltage difference between MUXOUT and AMPIN at t1. Note that, as in FIG. 2, the parallel break lines indicate that SW1 and SS 132 can be on for any length of time (and thus MUXOUT remains at the AIN1 level for the same length of time).

Upon a switch in MUX 114 from the input source for AIN1 to the input source for AIN2, SC2 is first negated, at time t3, so as to turn off (e.g. open) SW1. SS 132 is also turned off at time t3. The turning off SW1 at time t3 begins make-before-break time 402. As with make-before-break time 202, make-before-break time 402 can be set to a predetermined duration and controlled by control logic 150. During make-before-break time 402, MUXOUT is pulled to VDD or VEE. In the case of waveform 404, at time t3, SD 121 is turned on (closed), thus enabling IDD 118 to pull MUXOUT at node 130 up to VDD. MUXOUT increases to VDD with a slope of dV/dt determined by IDD/CS. In the case of waveform 406, at time t3, SE 128 is turned on (closed), thus enabling IEE 124 to pull MUXOUT at node 130 down to VEE. MUXOUT decreases to VEE with a slope of dV/dt determined by IEE/CS.

After the make-before-break time, at time t4, SW2 of MUX 114 is turned on so as to now provide AIN2 as MUXOUT. However, at time t4, SS 132 remains off. Therefore, as seen in both waveforms 404 and 406, upon closing SW2 at time t4, MUXOUT begins transitioning to the voltage level of AIN2 in accordance with the time constant corresponding to RS*RC (since RS 134 is not shorted out). At time t5, which occurs a predetermined short amount of time after t4 but while SW2 is still on, SS 132 is turned on (e.g. closed), allowing MUXOUT to quickly finish transitioning to AIN2, no longer in accordance with the time constant (since RS 134 is shorted out). Note that, again, the parallel break lines indicate that SW2 and SS 132 can be on for any length of time (and thus MUXOUT remains at the AIN2 level for the same length of time).

Upon a subsequent switch in MUX 114 from the input source for AIN2 to the input source for AIN3, a make-before-break time is used, starting at time t6, between turning off SW2 and turning on SW3. During this make-before-break time, MUXOUT is again either pulled up to VDD (as in waveform 206) or pulled down to VEE (as in waveform 208). After make-before-break time, at time t7, SW3 is turned on, followed by turning on SS 132 at time t8. In this manner, benefits from both the pull up to VDD or pull down to VEE as well as the selective shorting of RS 134 with SS 132 can be obtained.

Referring back to FIG. 1, to protect against surge events (which are relatively slow and longer in duration as compared to ESD events), ESD clamping diodes 112 shunt surge currents to VDD and VEE, and diodes 102 and 104 clamp VDD and VEE, respectively. Surge tolerance can be improved by using larger ESD device for the clamping diodes, but this results in increasing the circuit size. Therefore, to further improve the surge tolerance level, over-voltage protection circuit 148 includes fast-acting comparators which trigger during surge or fault events, and in response thereto, disconnects all the MUX switches of MUX 114 which are connected to pins 110. For example, if the voltage at node 130 falls below VTL, OVL is asserted, and if the voltage at node 130 goes above VTH, OVH is asserted. If either comparator is triggered (i.e. if either OVL or OVH is asserted), OV is asserted, corresponding to the output of OR gate 158. If OV is asserted, all switches within MUX 114 (SW1-SW4) are turned off (opened). In this manner, all core circuits within the IC (coupled, for example, to ADC 144) are protected by isolation. This is analogous to having a dedicated circuit breaker, in which the switches within MUX 114 operate as a breaker if node 130 comes close to or exceeds VDD or VEE. Therefore, in one embodiment, VTH is set to be slightly lower than VDD, and VTL is set to be slightly higher than VEE. When all switches open in response to the assertion of OV to isolate the circuits within the IC, diodes 112, 102, and 104 continue to operate to take care of the surge or ESD event. Also, note that over-voltage protection circuit 148 is disabled during channel switching (such as when MUXOUT is being pulled up/down by pull-up circuit 118/pull-down circuit 154). In this manner, over-voltage protection circuit 148 is in active mode while MUX 114 is connected to an active input channel.

Figure 5:
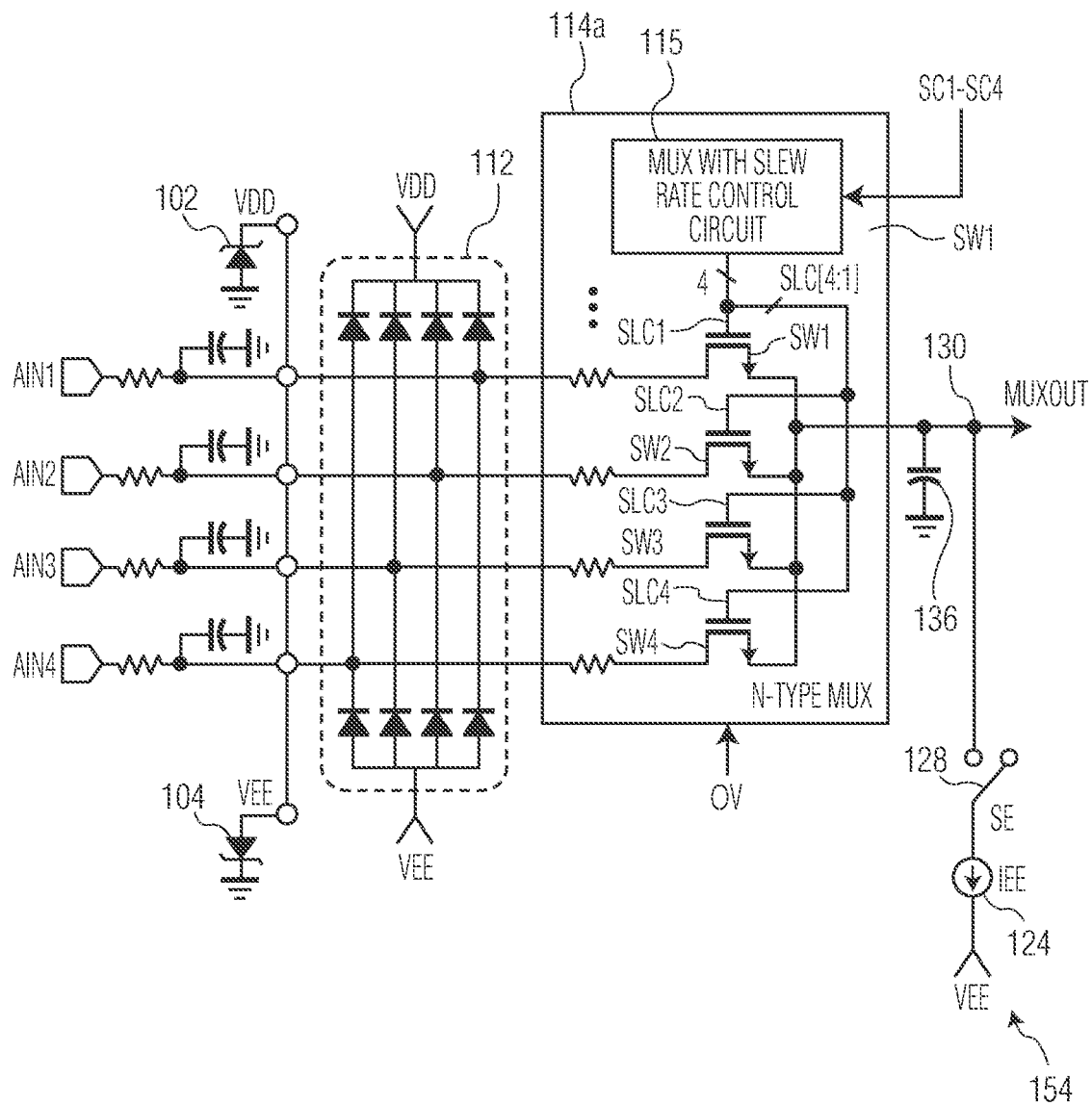
FIG. 5 illustrates, in partial schematic and partial block diagram form, an implementation of the input MUX of FIG. 1, in accordance with one embodiment of the present invention.
Figure 6:
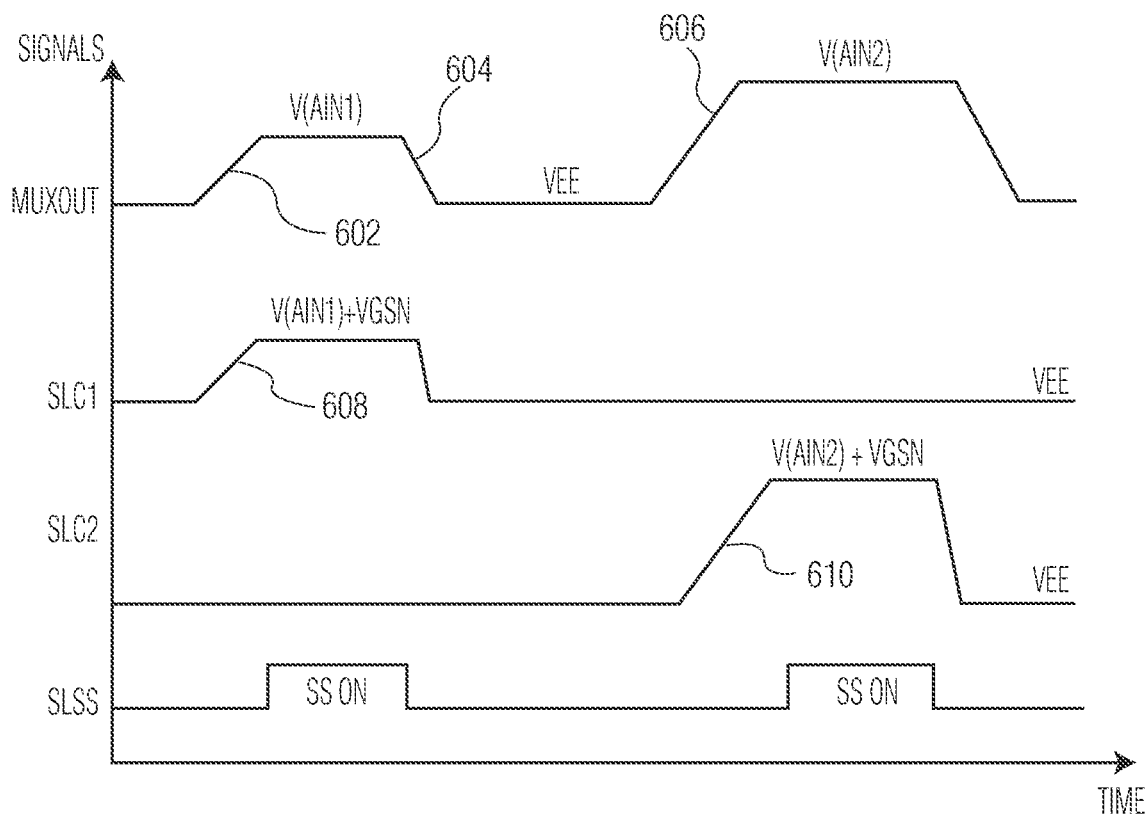
FIG. 6 illustrates a timing diagram illustrating various signals within the input MUX system of FIG. 1 using the implantation of the input MUX of FIG. 5, in accordance with one embodiment of the present invention.
Figure 7:
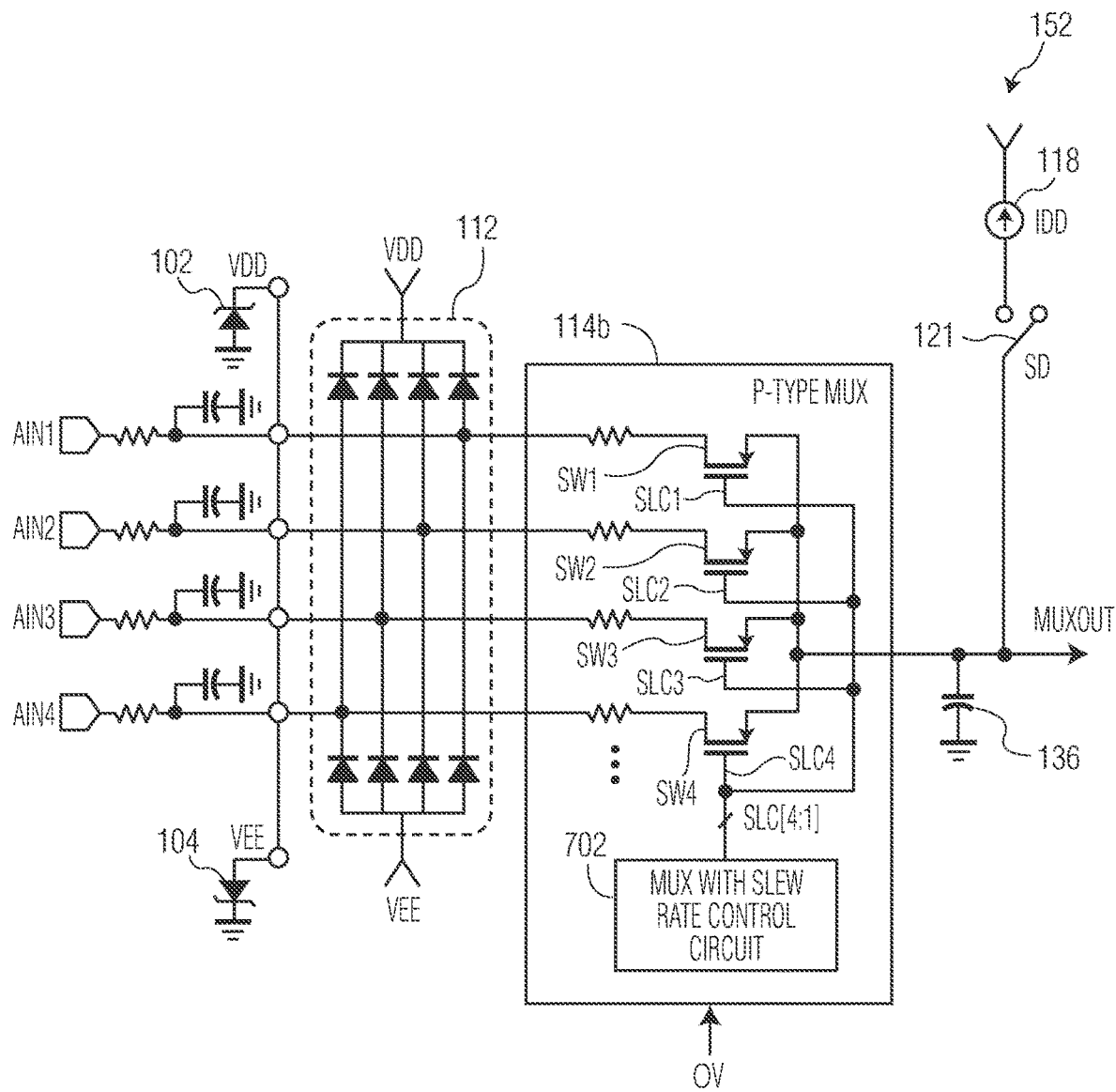
FIG. 7 illustrates, in partial schematic and partial block diagram form, an implementation of the input MUX of FIG. 1, in accordance with another embodiment of the present invention.
Figure 8:
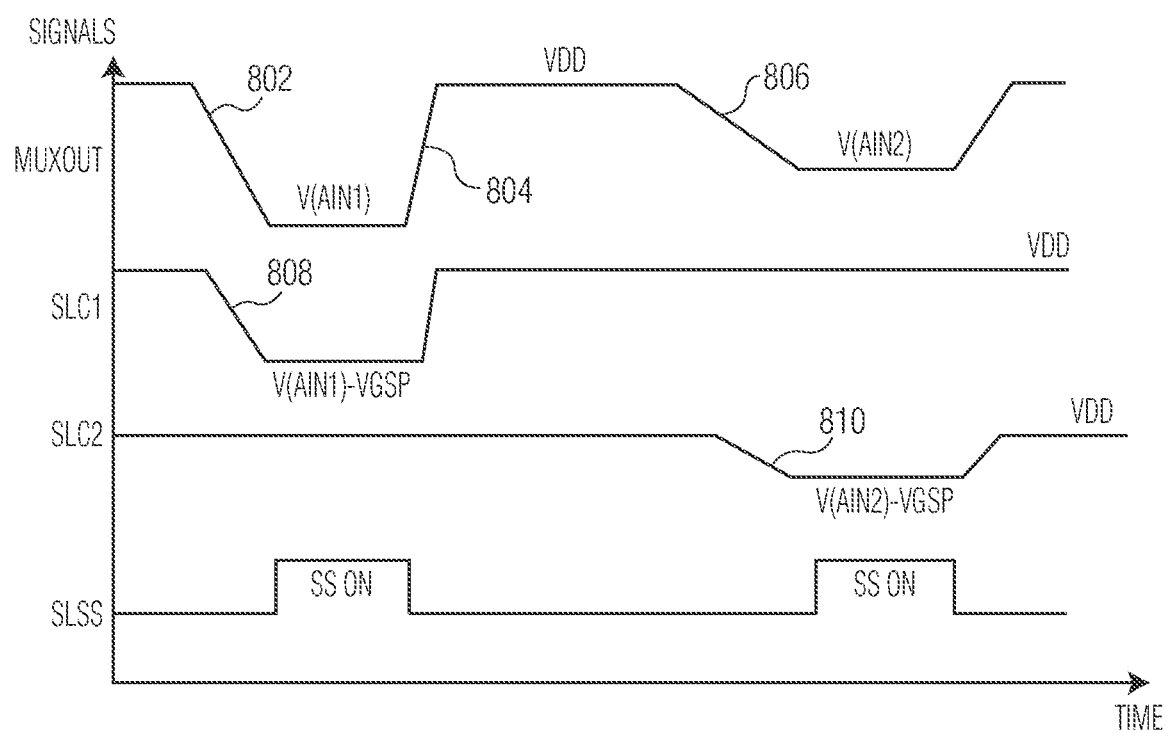
FIG. 8 illustrates a timing diagram illustrating various signals within the input MUX system of FIG. 1 using the implantation of the input MUX of FIG. 7, in accordance with another embodiment of the present invention.

FIGS. 5 and 7 each illustrate a portion of system 100, in accordance with the first aspect, which implements the switches in MUX 114 (SW1-SW4) as either N-type metal-oxide-semiconductor (NMOS) transistors (FIG. 5) or P-type metal-oxide-semiconductor (PMOS) transistors (FIG. 7). By using NMOS or PMOS transistors as the switches in MUX 114, the slew rate of MUXOUT can be further controlled to match either the positive slew rate of amplifier 140 (with NMOS transistors) or the negative slew rate of amplifier 140 (with PMOS transistors). In the examples of FIGS. 5 and 7, operation of SS 132 and RS 134 can be as described above in reference to the first aspect (e.g. with the timing diagrams of FIGS. 2 and 4). Alternatively, SS 132 and RS 134 may not be present in which node 130 is coupled to the non-inverting input of amplifier 140 such that MUXOUT is provided directly as AMPIN. FIG. 6 illustrates a timing diagram corresponding to a few signals used within the embodiment of system 100 using the NMOS implementation of MUX 114 of FIG. 5, and FIG. 8 illustrates a timing diagram corresponding to a few signal used within the embodiment of system 100 using the PMOS implementation of MUX 114 of FIG. 7. In both the timing diagrams of FIGS. 6 and 8, it is assumed that SS 132 and RS 134 are present in system 100.

Referring to FIG. 5, FIG. 5 illustrates a portion of system 100 which implements MUX 114 with MUX 114a and includes pull-down circuit 154 (rather than pull-up circuit 152). MUX 114a uses NMOS transistors for the switches SW1-SW4. As illustrated in FIG. 5, MUX 114a includes MUX with slew rate control circuit 115, and each of SW1-SW4 is implemented with an NMOS transistor. Each input signal of AIN1-AIN4 is received via a resistor of MUX 114a to a first current electrode of a corresponding switch of SW1-SW4. The second current electrodes of SW1-SW4 are all connected to circuit node 130 and provide MUXOUT. MUX with slew rate control circuit 115 receives SC1-SC4, and provides slew control voltages SLC[4:1] to the control electrodes of SW1-SW4. The control electrode of each switch receives a corresponding SLC voltage (e.g. SW1 receives SLC1, SW2 receives SLC2, SW3 receives SLC3, and SW4 receives SLC4). Operation will be described in reference to the timing diagram of FIG. 6.

In FIG. 6, AIN1 is provided as the input signal to MUX 114a, therefore, SC1 can be asserted to as to indicate that SW1 should be turned on (closed). MUX with slew rate control circuit 115 provides a voltage as SLC1 to the control electrode of SW1 to turn on SW1. Therefore, as seen in the second waveform of FIG. 6, SLC1 increases from VEE to the voltage level of AIN1+the NMOS gate to source voltage (VGSN) of SW1. The voltage value of SLC1 controls the ramping up (608) of SLC1 and is set by MUX with slew rate control circuit 115 such that the ramping up matches the positive slew rate of amplifier 140. As a result, the ramp up (602) of MUXOUT from VEE to the voltage level of AIN1 is limited by the gate voltage level SLC1. Note that while SW1 is being controlled to provide AIN1 as MUXOUT, SS 132 is closed, thus shorting RS 134.

Upon a switch in channels to AIN2, SLC1 is negated (e.g. set to 0V so as to turn off SW1). SE 128 is closed so as to enabled pull-down circuit 154 which pulls MUXOUT down to VEE. When SLC1 is negated, SS 132 is also negated. The ramp down (604) of MUXOUT is therefore controlled by IEE 124 and RS 134. During the make-before-break time (with SE 128 closed), MUXOUT remains at VEE. Afterwards, SC2 is asserted to indicate that SW2 should now be turned on (closed), and MUX with slew rate control circuit 115 provides a voltage as SLC2. As illustrated in FIG. 6, SLC2 increases from VEE to the voltage level of AIN2+ VGSN of SW2. As before, the value of SLC2 controls the ramping up (610) of SLC2 and is set by MUX with slew rate control circuit 115 such that the ramping up matches the positive slew rate of amplifier 140. As a result, the ramp up (606) of MUXOUT from VEE to the voltage level of AIN2 is limited by the gate voltage level SLC2. Note also that, in this embodiment, SLC1 and SLC2 are at VEE to turn the corresponding switches off, and the rising edges 602 and 606 follow the slopes of rising edges 608 and 610 of SLC1 and SLC2, respectively.

FIG. 7 operates in a very similar manner, however, system 100 of FIG. 7 uses pull-up circuit 152 rather than pull-down circuit 154, and implements MUX 114 with MUX 114b in which PMOS transistors rather than NMOS transistors are used for switches SW1-SW4. In FIG. 7, the SLC voltages are set so that the downward ramps (e.g. 808, 810) of the SLCs are controlled to match the negative slew rate of amplifier 140. For example, MUX with slew rate control circuit 115 provides the voltage SLC1 to the control electrode of SW1 to turn on SW1, and, as illustrated in FIG. 8, SLC1 decreases (from VDD) to the voltage level of AIN1– the PMOS gate to source voltage (VGSP) of SW1. SLC1 is controlled such that this ramp down (808) matches the negative slew rate of amplifier 140. As a result, the ramp down (802) of MUXOUT from VDD to the voltage level of AIN1 is limited by the gate voltage level SLC2. Note that, as in FIG. 6, while SW1 is being controlled to provide AIN1 as MUXOUT, SS 132 is closed, thus shorting RS 134.

Upon switching from AIN1 to AIN2, during a make-before-break time after turning off SW1, SD 121 is turned on to pull MUXOUT to VDD. The ramp up (e.g. 804) to VDD during the make-before-break times is controlled by IDD 118 or RS 134. After the make-before-break time, gate voltage SLC2 is provided so as to turn on SW2. As illustrated in FIG. 8, SLC2 decreases from VDD to the voltage level of AIN2–VGSP of SW2. As before, the value of SLC2 controls the ramping down (810) of SLC2 and is set by MUX with slew rate control circuit 115 such that the ramping down matches the negative slew rate of amplifier 140. As a result, the ramp down (806) of MUXOUT from VDD to the voltage level of AIN2 is limited by the gate voltage level SLC2. Note also that, in this embodiment, SLC1 and SLC2 are at VDD to turn the corresponding switches off, and the falling edges 802 and 806 follow the slopes of falling edges 808 and 810 of SLC1 and SLC2, respectively.

Therefore, by now it can be appreciated how an improved input MUX system is capable of providing high speed switching, despite the slew rate limitations of the PGA, and without negatively impacting the resulting accuracy of the converted digital signal. In one embodiment, make-before-break times are inserted between changes of the selected input channel by the input MUX so as to either pull up or pull down the output of the input MUX after deselecting the current input channel and prior to selecting the next input channel. This may allow for improved settling times for the PGA and ADC of the input MUX system. In another embodiment, a switch in parallel with a resistor is added between the output of the input MUX and the input of the PGA such that, shortly after the input MUX selects a new input channel (and before deselecting the new input channel), the resistor can be bypassed by the switch in order to quickly charge up the capacitor coupled at the input of the PGA. This may also achieve improved settling times. Furthermore, as discussed above, both of these embodiments can be used together within an input MUX system.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Also for example, in one embodiment, the illustrated elements of system 100, except for the input RC filters, are circuitry located on a single integrated circuit or within a same device. Alternatively, system 100 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the pull-up and pull-down circuits can be implemented using different circuit topographies, and the switches can be implemented in a variety of different ways. Additionally, comparators and logic gates can be implemented differently, using any number of circuit elements or different circuit elements than those illustrated. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a multiplexer circuit configured to provide an output signal on a conductive line; a programmable gain amplifier having a non-inverting input connected to the conductive line to receive the output signal from the multiplexer; a slew rate adjust circuit connected at a first node on the conductive line between the multiplexer circuit and the programmable gain amplifier; a first switch including a first terminal connected to the first node and a second terminal connected to the input of the programmable gain amplifier; and a low pass filter connected between the first and second terminals of the first switch. In one aspect, the slew rate adjust circuit includes a current source including a first terminal coupled to a first supply voltage and a second terminal coupled to a first terminal of a second switch; the second switch includes a second terminal coupled to the first node. In another aspect, the integrated circuit further includes an over-voltage detection circuit coupled between the second terminal of the second switch and the first node, wherein an over voltage signal output by the over-voltage detection circuit is provided to the multiplexer circuit. In a further aspect, the over-voltage detection circuit includes a first comparator having a non-inverting input coupled to a second supply voltage that is higher than the first supply voltage and an inverting input coupled to the second terminal of the second switch; a second comparator having a non-inverting input coupled to the second terminal of the second switch and an inverting input coupled to a third supply voltage that is lower than a fourth supply voltage; and a logic gate including a first input coupled to an output of the first comparator, a second input coupled to an output of the second comparator, and an output of the logic gate is the over voltage signal. In another aspect, the low pass filter includes a resistive element including a first terminal coupled to the first node and a second terminal coupled to the second terminal of the first switch; and a capacitive element including a first terminal coupled to the second terminal of the resistive element and a second terminal coupled to ground. In another aspect, the slew rate adjust circuit is a pull-up circuit and the first supply voltage is a positive supply voltage. In another aspect, the slew rate adjust circuit is a pull-down circuit and the first supply voltage is a negative supply voltage. In yet another aspect, the integrated circuit further includes anti-parallel diodes coupled to the non-inverting input and an inverting input of the programmable gain amplifier. In a further aspect, the integrated circuit further includes an analog to digital converter including an input coupled to an output of the programmable gain amplifier.

In another embodiment, an integrated circuit includes a multiplexer including multiple inputs, a first control input, and an output; a programmable gain amplifier coupled to the output of the multiplexer; a slew rate adjust circuit coupled to the programmable gain amplifier, the amplifier slew rate adjust circuit including a current source including a first terminal coupled to a supply voltage and a second terminal coupled between the output of the multiplexer and the programmable gain amplifier; and an analog to digital converter coupled to an output of the programmable gain amplifier. In one aspect, the integrated circuit further includes a clamp circuit coupled to the programmable gain amplifier; and a first switch including a first terminal connected to the output of the multiplexer and a second terminal connected to an input of the clamp circuit. In a further aspect, the integrated circuit further includes a second switch including a first terminal coupled to the second terminal of the current source, and a second terminal coupled to the first terminal of the first switch. In yet a further aspect, the integrated circuit further includes an over-voltage detection circuit coupled between the second terminal of the second switch and the first terminal of the first switch, wherein an over voltage signal output by the over-voltage detection circuit is provided as a control input to the multiplexer. In yet an even further aspect, the over-voltage detection circuit includes: a first comparator having a non-inverting input coupled to a second supply voltage that is higher than the first supply voltage and an inverting input coupled to the second terminal of the second switch; a second comparator having a non-inverting input coupled to the second terminal of the second switch and an inverting input coupled to a third supply voltage that is lower than a fourth supply voltage; and a logic gate including a first input coupled to an output of the first comparator, a second input coupled to an output of the second comparator, and an output of the logic gate is the over voltage signal. In another aspect of the another embodiment, the slew rate adjust circuit is one of a group consisting of: a pull-up circuit and the first supply voltage is a positive supply voltage, and a pull-down circuit and the first supply voltage is a negative supply voltage.

In yet another embodiment, an integrated circuit includes a multiplexer including multiple inputs, an output, and a control input; a programmable gain amplifier including a first input, a second input, and an output; a first switch including a first terminal coupled to the output of the multiplexer and a second terminal coupled to the first and second inputs of the programmable gain amplifier; and a low pass filter circuit including a resistive element and a capacitive element, the resistive element is coupled in parallel with the first switch and the capacitive element includes a first terminal coupled to the second terminals of the first switch and the resistive element, and a second terminal coupled to ground. In one aspect, the integrated circuit further includes control circuitry to place the first switch in an open position when a signal at the output of the multiplexer changes and to place the first switch in a closed position after a predetermined time period. In a further aspect, the predetermined time period is based on a previous output of the multiplexer and output from a next channel of the multiplexer. In another aspect, a time constant of the low pass filter has a time constant that is proportional to a slew rate of the programmable gain amplifier. In yet another aspect, the integrated circuit further includes a clamp circuit coupled to the programmable gain amplifier; and an analog to digital converter including an input coupled to an output of the programmable gain amplifier.

What is claimed is:

1. An integrated circuit, comprising:
    a multiplexer circuit configured to provide an output signal on a conductive line;
    a programmable gain amplifier having a non-inverting input connected to the conductive line to receive the output signal from the multiplexer;
    a slew rate adjust circuit connected at a first node on the conductive line between the multiplexer circuit and the programmable gain amplifier;
    a first switch including a first terminal connected to the first node and a second terminal connected to the non-inverting input of the programmable gain amplifier; and
    a low pass filter connected between the first and second terminals of the first switch.

2. The integrated circuit of claim 1, wherein the slew rate adjust circuit includes:
    a current source including a first terminal coupled to a first supply voltage and a second terminal coupled to a first terminal of a second switch;
    the second switch includes a second terminal coupled to the first node.

3. The integrated circuit of claim 1, further comprising:
    an over-voltage detection circuit coupled between the second terminal of the second switch and the first node, wherein an over voltage signal output by the over-voltage detection circuit is provided to the multiplexer circuit.

4. The integrated circuit of claim 3, wherein the over-voltage detection circuit includes:
    a first comparator having a non-inverting input coupled to a second supply voltage that is higher than the first supply voltage and an inverting input coupled to the second terminal of the second switch;
    a second comparator having a non-inverting input coupled to the second terminal of the second switch and an inverting input coupled to a third supply voltage that is lower than a fourth supply voltage; and
    a logic gate including a first input coupled to an output of the first comparator, a second input coupled to an output of the second comparator, and an output of the logic gate is the over voltage signal.

5. The integrated circuit of claim 2, wherein the low pass filter includes:
    a resistive element including a first terminal coupled to the first node and a second terminal coupled to the second terminal of the first switch; and
    a capacitive element including a first terminal coupled to the second terminal of the resistive element and a second terminal coupled to ground.

6. The integrated circuit of claim 1, wherein the slew rate adjust circuit is a pull-up circuit and the first supply voltage is a positive supply voltage.

7. The integrated circuit of claim 1, wherein the slew rate adjust circuit is a pull-down circuit and the first supply voltage is a negative supply voltage.

8. The integrated circuit of claim 1, further comprising:
    anti-parallel diodes coupled to the non-inverting input and an inverting input of the programmable gain amplifier.

9. The integrated circuit of claim 8, further comprising:
    an analog to digital converter including an input coupled to an output of the programmable gain amplifier.

10. An integrated circuit, comprising:
a multiplexer including multiple inputs, a first control input, and an output;
a programmable gain amplifier coupled to the output of the multiplexer;
a slew rate adjust circuit coupled to the programmable gain amplifier, the slew rate adjust circuit including:
a current source including a first terminal coupled to a first supply voltage and a second terminal coupled between the output of the multiplexer and the programmable gain amplifier; and
an analog to digital converter coupled to an output of the programmable gain amplifier,
wherein the slew rate adjust circuit is one of a group consisting of:
a pull-up circuit and the first supply voltage is a positive supply voltage, and
a pull-down circuit and the first supply voltage is a negative supply voltage.

11. An integrated circuit, comprising:
a multiplexer including multiple inputs, a first control input, and an output;
a programmable gain amplifier coupled to the output of the multiplexer;
a slew rate adjust circuit coupled to the programmable gain amplifier, the slew rate adjust circuit including:
a current source including a first terminal coupled to a first supply voltage and a second terminal coupled between the output of the multiplexer and the programmable gain amplifier;
an analog to digital converter coupled to an output of the programmable gain amplifier;
a clamp circuit coupled to the programmable gain amplifier; and
a first switch including a first terminal connected to the output of the multiplexer and a second terminal connected to an input of the clamp circuit.

12. The integrated circuit of claim 11, further comprising:
a second switch including a first terminal coupled to the second terminal of the current source, and a second terminal coupled to the first terminal of the first switch.

13. The integrated circuit of claim 12, further comprising:
an over-voltage detection circuit coupled between the second terminal of the second switch and the first terminal of the first switch, wherein an over voltage signal output by the over-voltage detection circuit is provided as a control input to the multiplexer.

14. The integrated circuit of claim 13, wherein the over-voltage detection circuit includes:
a first comparator having a non-inverting input coupled to a second supply voltage that is higher than the first supply voltage and an inverting input coupled to the second terminal of the second switch;
a second comparator having a non-inverting input coupled to the second terminal of the second switch and an inverting input coupled to a third supply voltage that is lower than a fourth supply voltage; and
a logic gate including a first input coupled to an output of the first comparator, a second input coupled to an output of the second comparator, and an output of the logic gate is the over voltage signal.

15. An integrated circuit comprising:
a multiplexer including multiple inputs, an output, and a control input;
a programmable gain amplifier including a first input, a second input, and an output;
a first switch including a first terminal coupled to the output of the multiplexer and a second terminal coupled to the first and second inputs of the programmable gain amplifier; and
a low pass filter circuit including a resistive element and a capacitive element, the resistive element is coupled in parallel with the first switch and the capacitive element includes a first terminal coupled to the second terminals of the first switch and the resistive element, and a second terminal coupled to ground.

16. The integrated circuit of claim 15, further comprising:
control circuitry to place the first switch in an open position when a signal at the output of the multiplexer changes and to place the first switch in a closed position after a predetermined time period.

17. The integrated circuit of claim 16, wherein the predetermined time period is based on a previous output of the multiplexer and output from a next channel of the multiplexer.

18. The integrated circuit of claim 15, wherein a time constant of the low pass filter has a time constant that is proportional to a slew rate of the programmable gain amplifier.

19. The integrated circuit of claim 15, further comprising:
a clamp circuit coupled to the programmable gain amplifier; and
an analog to digital converter including an input coupled to an output of the programmable gain amplifier.

* * * * *